United States Patent [19]

Severus-Laubenfeld

[11] 4,239,610

[45] Dec. 16, 1980

[54] DEVICE FOR THE PRODUCTION OF ANODIZED MATERIAL

[75] Inventor: Harald Severus-Laubenfeld, Schaffhausen, Switzerland

[73] Assignee: Swiss Aluminium Ltd., Chippis, Switzerland

[21] Appl. No.: 51,453

[22] Filed: Jun. 22, 1979

Related U.S. Application Data

[60] Continuation-in-part of Ser. No. 926,280, Jul. 20, 1978, Pat. No. 4,127,177, Division of Ser. No. 764,001, Jan. 31, 1977, abandoned, which is a continuation of Ser. No. 489,417, Jul. 17, 1974, abandoned.

[30] Foreign Application Priority Data

Aug. 13, 1973 [DE] Fed. Rep. of Germany ....... 2340962

[51] Int. Cl.³ .............................................. C25D 11/04
[52] U.S. Cl. ..................................... 204/211; 204/228; 204/231
[58] Field of Search ............... 204/207, 206, 211, 218, 204/223, 228, 231

[56] References Cited

U.S. PATENT DOCUMENTS

| 2,541,275 | 2/1951 | Odier | 204/211 |
|---|---|---|---|
| 2,951,025 | 8/1960 | Mostovych et al. | 204/211 |
| 3,074,857 | 1/1963 | Altenpohl | 204/206 X |
| 3,510,410 | 5/1970 | Rosenthal et al. | 204/211 X |
| 3,864,235 | 2/1975 | Bobrov et al. | 204/211 X |
| 3,970,537 | 7/1976 | Froman et al. | 204/206 X |

Primary Examiner—Arthur C. Prescott
Attorney, Agent, or Firm—Bachman and LaPointe

[57] ABSTRACT

A device for the production of anodized aluminum or aluminum alloy foil including a strip of foil, an electrolyte bath with a plurality of cathodes therein and an entry point thereto, and an anode roll spaced from the entry point, wherein the effect of the cathodes is increased with increasing distance from the entry point.

9 Claims, 7 Drawing Figures

DEVICE FOR THE PRODUCTION OF ANODIZED MATERIAL

CROSS REFERENCE TO RELATED APPLICATIONS

This application is a Continuation-In-Part of application Ser. No. 926,280, filed July 20, 1978, now U.S. Pat. No. 4,127,177 which in turn is a Division of application Ser. No. 764,001, filed Jan. 31, 1977, now abandoned which in turn is a Continuation of application Ser. No. 489,417, filed July 17, 1974, now abandoned.

BACKGROUND OF THE INVENTION

The present invention relates to anodizing aluminum or aluminum alloy foil, and in particular deals with composite material for graphic applications wherein the aluminum is adhered to a substrate, as in the production of nameplates.

For the manufacture of so-called printed circuits it is known to cover a sheet of electrically conductive metal, e.g. copper which is stuck on to a support plate, with a light-sensitive plastic, a so-called PR layer (Photo Resist layer), to expose a master pattern laid on top of this composite to UV light, whereby the PR layer is hardened at those places where the master pattern is transparent, to dissolve away the unexposed parts of the PR layer and then to etch away the metal layer lying under these parts. This process has already found wide application in the electronics industry but in the graphics industry has up to now not been used, or has found no application worth mentioning.

A composite material consisting of an aluminum foil stuck on to a plastic support film has already been known for a long time for packaging or insulating purposes.

The object of the invention is to produce for graphical applications in particular for nameplate production, a particularly suitable composite material and a device for its manufacture. A particular object of the invention is to provide an improved device for anodizing aluminum foil.

SUMMARY OF THE INVENTION

To fulfill this objective a composite material of the kind described earlier is in terms of the invention characterized in that the aluminum foil bears, on its side facing away from the supporting layer, an aluminum oxide layer which is thick by comparison with the thickness of the aluminum foil and on top of this oxide layer a further layer of light-sensitive plastic (PR layer).

The thickness of the aluminum foil is advantageously 5 to 100 μm, preferably 20 to 50 μm and the thickness of the oxide layer at least 3 μm, usefully 4 to 14 μm. Such an aluminum oxide layer is relatively thick by comparison with the thickness of the aluminum foil but is however necessary to achieve the color constancy of the normally colored aluminum oxide layer.

A preferred thickness of the support layer, which is preferably made of plastic, is 100 to 200 μm, but plastic sheet of thickness greater than 1 mm can also be used.

In accordance with the device of the present invention one provides anodized aluminum or aluminum foil (including said composite material). The device comprises: a strip of said foil; and electrolyte bath and an entry point to said bath; an anode roll spaced from said entry point and bath over which the foil passes on its way to said entry point and bath; a plurality of cathodes in said electrolyte bath through which the foil passes, wherein the effect of said cathodes is increased with increasing distance of the foil in the electrolyte from the point of entry.

With the described composite material patterns, e.g. inscriptions, can be made easily, in a similar way to that known in printed circuit technology. Thus a master pattern, e.g. a film negative is laid on the composite material on the side covered with the light-sensitive PR layer. The composite is then "illuminated", i.e. exposed to UV light through the master pattern. As a result of the so-called negative-positive process those parts of the PR layer which receive the UV light are hardened while those parts which are under the nontransparent parts of the master pattern remain unchanged. The subsequent developing then removes chemically the parts of the PR layer which were not exposed to the UV light, so that the aluminum oxide layer is laid bare at these places. The composite is then etched, removing aluminum oxide and aluminum up to the plastic support layer where the PR layer has already been removed. The support film then shows through these places.

With the so-called positive-negative process the developing stage removes the parts exposed to the UV light. Finally, since the PR layer is not weather resistant the PR layer is also removed from the exposed areas by so-called stripping.

The described composite material can be used for graphical applications, e.g. for putting patterns on interior surfaces and on facades, in particular to great advantage in the production of nameplates. While nameplates have normally been produced individually by an engraving process and in series by printing, a plate can now be produced with very great time saving, in only a few minutes and by unskilled labor, such that the composite material, as described, is given a pattern and if desired mounted on to a stiffer substrate, e.g. an aluminum plate. Every nameplate user can produce his own plates, in particular individual plates or small series, without having to make a large investment.

Using the composite material in place of a homogeneous material with only one component, e.g. an aluminum sheet, as has already been suggested for graphical purposes, has the following advantages: With the described treatment it is etched down to the plastic support film which is resistant to weathering and corrosion, and not to the blank aluminum which is susceptible to attack by corrosion. The composite material with the pattern is therefore more corrosion resistant. This corrosion resistance can be achieved, if aluminum is used, only by a subsequent treatment, e.g. by anodizing afterwards. The plastic support layer can be colored in colors of one's choice, preferably in colors which contrast with the coloring of the aluminum oxide layer. With a simple aluminum base the pattern can only take on the color of the bare aluminum on the etched places. The composite material makes possible therefore a large variety of color combinations which are given by the color of the plastic support layer and the coloring of the aluminum oxide layer.

A process for the manufacture of the described composite material whereby a foil material is constructed by adhesively coating a support layer with a blank aluminum foil is in accordance with the invention characterized by the following further stages of the process.

(a) Providing the foil material on the blank side of the aluminum foil with an aluminum oxide layer which is thick in terms of the small thickness of the foil.
(b) Coloring the aluminum oxide layer.
(c) Sealing the aluminum oxide layer.
(d) Coating the composite with a layer of light-sensitive plastic (PR layer).

Particularly in stage "(a)" problems which have never arisen before in the oxidation of aluminum have to be solved. These problems result mainly from the fact that a relatively thin foil has to be provided with an aluminum oxide layer which is thick in relation to the foil thickness. The aluminum oxide layer must therefore be relatively thick so that uniform and fast colors are achieved on coloring the oxide layer.

Usefully the aluminum oxide layer is produced by anodizing the foil material in an electrolyte bath, i.e. the aluminum foil which is already stuck on to the plastic support foil is anodized, whereby the foil material is preferably transported continuously as an endless coil through the electrolytic bath to achieve rapid and economic anodizing.

The problems mentioned in association with this way of producing the oxide layer arise mainly because a very thin foil material has to be provided with an aluminum oxide layer which is relatively thick in terms of the thickness of the aluminum foil. It is the smallness of cross section transporting the anodizing current to the strip of foil material which leads to the foil material being heated up. This heating up is all the more inconvenient since the plastic of the support layer, unlike the aluminum foil, exhibits a thermoplastic behavior which can lead to stretching or creasing of the foil material.

As a remedy for this a further development of the invention provides for the foil material to be cooled in the air space between anode and entry into the bath and for the foil material to be led through the bath, past one, preferably several cathodes, whereby a stream of air has been found to be a favorable cooling medium. The mentioned air space is otherwise kept as short as possible.

A further problem in continuous anodizing is that with increasing distance along the moving strip of foil material away from the point of entry into the bath the thicker is the aluminum oxide layer and thus the higher is the electrical resistance. In accordance with a particularly useful development of the present invention, in order to guarantee a uniform oxidation over the whole length of the bath, it is arranged that the effect of the cathodes on the foil material is increased with increasing distance from the point of entry into the bath. This can take place for example by the cathodes, spaced out next to and along the length of the strip to be anodized, being positioned increasingly closer to the strip and/or being supplied with increasingly larger cathode voltage, with increasing distance from the point of entry into the bath.

The strip can be deflected several times in the electrolytic bath. A particular simple arrangement is found by passing the strip of foil material, which is to be anodized, horizontally in a straight line through the electrolytic bath. However at the exit end of the bath, with this arrangement an overflow must be provided.

BRIEF DESCRIPTION OF THE DRAWINGS

The invention is explained in more detail with the aid of the following schematic drawings. These show.

DETAILED DESCRIPTION

Figure 1:
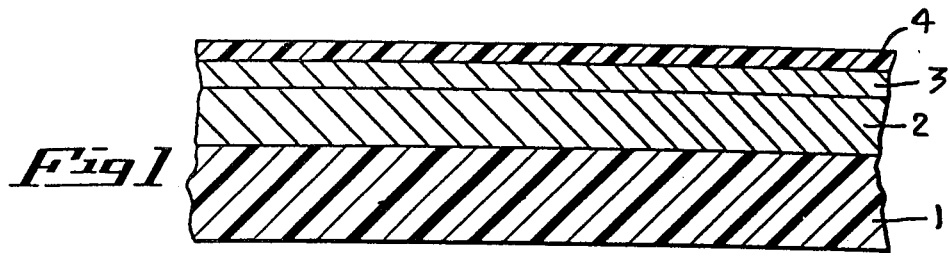
FIG. 1: A section through a composite material in accordance with the invention.

The composite material of FIG. 1 has four layers. The bottom layer is a supporting layer 1 of flexible plastic which is stable with respect to light rays, etch-proof and heat-proof. The stability with respect to light rays is achieved by the plastic having a known additive which absorbs UV light rays, mixed into it before being manufactured as a foil for the supporting layer 1. The plastic can be a polyester. The thickness of the support film can be 100 to 200 $\mu$m, by way of example 180 $\mu$m.

An aluminum foil 2 is stuck on to the support film 1 by means of an adhesive which is not shown here. The thickness of the aluminum foil is preferably 5 to 100 $\mu$m, by way of example 40 $\mu$m.

On the side of the aluminum foil facing away from the supporting layer 1 there is an aluminum oxide layer 3 which is at least 3 $\mu$m thick. In one example the aluminum oxide layer is 8 $\mu$m.

On top of the aluminum oxide layer 3 there is a layer 4 of light-sensitive plastic, a so-called PR layer (Photo Resist layer). The plastic of the layer has the property of hardening when exposed to UV light. Both the aluminum oxide layer 3 and the supporting layer 1 can be colored, if desired in contrasting colors. The supporting foil 1 can also be transparent.

A description of how the composite material of the construction just described is provided with a visible pattern will now be given with the aid of FIGS. 2-5.

Figure 2:
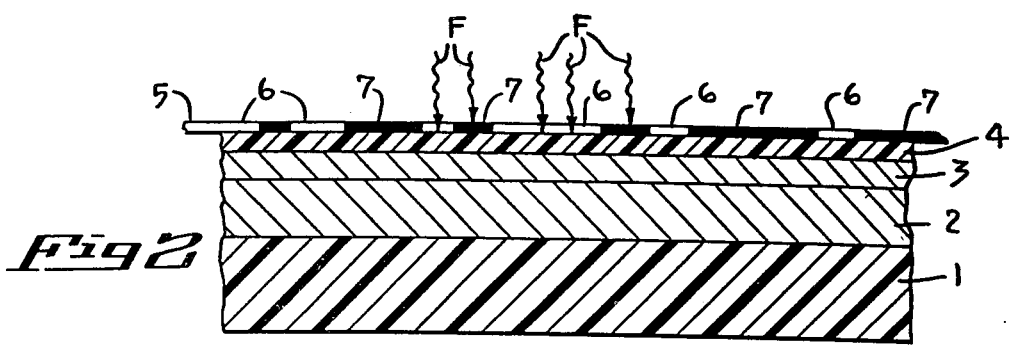
FIGS. 2-5: Sectional views as in FIG. 1 showing the basic stages of production of a graphic pattern on a composite material as in FIG. 1.

FIG. 2 shows the first stage of production of such a pattern. A master pattern, e.g. a film negative 5 is laid next to the PR layer. The master pattern has light-transparent areas 6, and areas 7 shown as dark in the drawing and which are nontransparent. The master pattern is then illuminated with UV light in such a way that the UV light is traveling approximately parallel to the arrow F when it strikes the master pattern. The master pattern allows the UV light to pass through the transparent areas 6 where it strikes the PR layer beneath and causes the PR layer to be hardened there (negative-positive process). The parts of the PR layer under the nontransparent areas 7 remain unchanged. In the same way a positive-positive process could be used whereby on developing, the exposed areas are removed.

The stage just described was mentioned in the introduction as the "illumination stage".

In the following two stages portrayed by FIGS. 3 and 4, the "developing" takes place.

Figure 3:
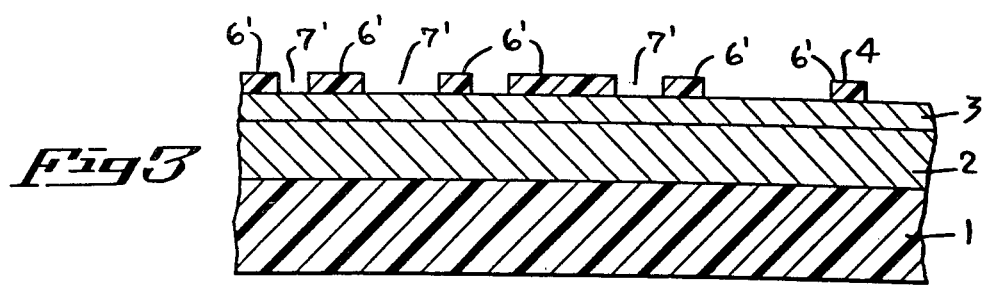
Figure 4:
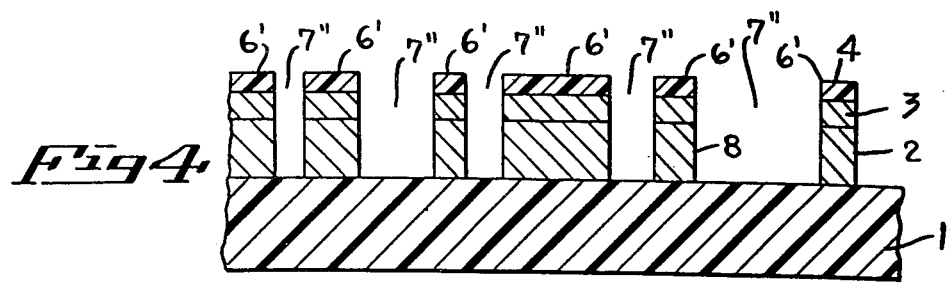

In these stages the areas of the PR layer lying under the nontransparent parts 7 of the master pattern as in FIG. 2 and which were not hardened, are removed using a solvent so that hollow spaces 7' are produced as shown in FIG. 3. Those parts of the PR layer which were at the light areas 6' remain unchanged. In this way a faintly visible relief pattern of the master pattern is produced on the composite.

Figure 5:
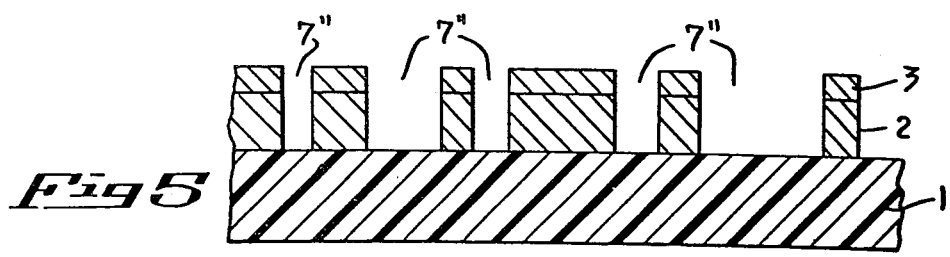

In order to make this image visible, the material of layers 2 and 3 lying immediately below the places where the PR layer was removed is etched away to expose the supporting foil 1 leaving deeper hollows 7". Even if the sides 8 of the hollows 7" are not as vertical to the supporting foil 1 as shown in FIGS. 4 and 5, on etching an accuracy of the same order of magnitude as picture points is achieved with the projections at the light areas. The copying of the pattern can in practice be of such a high quality that grey and intermediate tones can be reproduced.

In a final stage as shown in FIG. 5 and termed here as "stripping", the PR layer on the hardened areas are removed with an organic solvent to prevent the quality of the pattern produced from degenerating as a result of fading of the remaining part of the PR layer.

The reactions shown in FIGS. 2 to 5 can take place within a few minutes in a highly automated unit.

The finished article as in FIG. 5 bears a durable pattern on a flexible substrate and depending on the coloring of the aluminum oxide layer 3 and the coloring of the transparent or opaque supporting layer 1, offers graphic images of the most varied kind which can find applications of the widest possible variety.

The composite material in accordance with FIG. 1 is particularly suitable for fast and inexpensive production of nameplates, instruction panels, etc. The plate bearing a pattern, e.g. an inscription, produced as shown in FIGS. 2-5, can be mounted on a rigid supporting plate or can be affixed directly to the place of application. The latter method of use offers the advantage that because the composite is flexible it can be mounted around corners or edges.

Devices and a process of manufacturing the composite will now be described with the aid of FIGS. 6 and 7.

Figure 6:
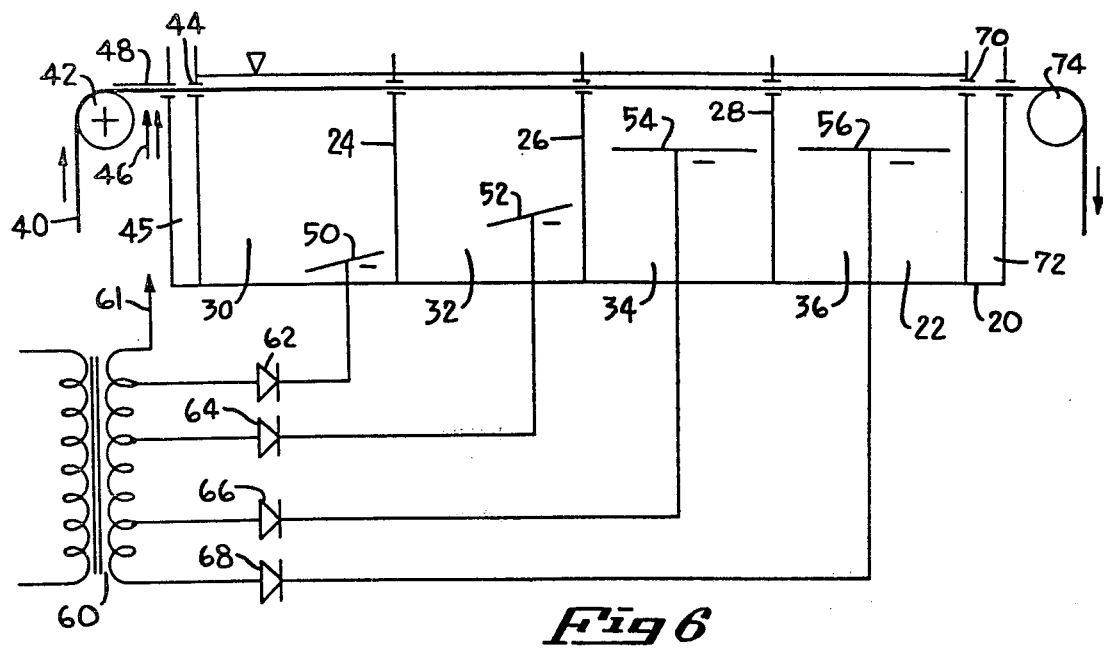
FIG. 6: A sectional front view, schematically drawn, of a device for providing a strip shaped foil of aluminum, which may be stuck on to a plastic support foil, with an aluminum oxide layer.

The device shown in FIG. 6 in cross section has a container for an electrolyte 22, e.g. a dilute sulphuric acid. The electrolyte is subdivided by exchangeable separating walls 24, 26 and 28 into chambers 30, 32, 34 and 36.

A strip 40 of foil material is led upwards to an anode roll 42 denoted by a + sign from a supply coil not shown in FIG. 6. The strip may be a laminate produced by sticking a blank aluminum foil on to a plastic support foil, or may simply be the aluminum foil. The thickness of the support foil, if used, is at least 10 $\mu$m, e.g. 180 $\mu$m, while the aluminum is 5 to 100 $\mu$m thick, e.g. 40 $\mu$m. The aluminum side of the strip 40 faces the anode roll so that the anodizing current can be taken up by the strip from the roll.

The anodizing roll 42 deflects the strip 40 through 90° so that the strip 40 passes horizontally through the electrolyte. The strip 40 may be cooled between the entry slit and the anode roll 42 by a ventilator fan (not shown here), which blows a stream of air on to the aluminum side of the foil in the direction of the arrow 46. The air cooling has been found to be surprisingly useful. With it a deformation due to excessive heating can be avoided. This excessive heating arises because a large electrical current has to be passed through a very small cross section. Because the cross section of the aluminum is very small the electrical resistance is very high and leads to the heating effect just mentioned.

The amount of cooling can be kept small by making the distance between the anode roll 42 and the inlet slit 44 to the bath as short as possible. Such a construction is preferred therefore. There is however a lower limit to the diameter which the anode roll 42 can have. Thus a construction, in which a special deflection roll of small diameter is used, is preferred. This deflection roll is advantageously watercooled. The larger diameter, separate anode roll is placed as close as possible to the electrolyte. Such a construction is shown in FIG. 7 which is still to be described.

The heat developed between the point at which the strip leaves the anode roll and the point of entry into the electrolyte is directly proportional to the square of the electric current supplied, to the square of the length of strip in the air between roll and electrolyte and inversely proportional to the strip speed. It is therefore advantageous if the cooling capacity of the ventilator can be regulated. A projecting wall 48 is provided to prevent any mechanical damage to the strip 40 between the anode roll 42 and the entry slit 44, the said projecting wall 48 preventing the strip 40 from buckling under the pressure of the cold air stream.

Cathodes 50, 52, 54 and 56 are provided in the tank sections 30 to 36. The cathodes can desirably be tilted at various angles.

One of the main difficulties in continuous anodizing is to distribute the current uniformly during the oxidation process in order to keep the properties and the growth of the oxide layer constant. The oxide layer can be regarded as an ohmic resistance. The voltage loss increases therefore along the whole length of the bath so that there is tendency for the greater part of the current to flow in the unoxidized or little oxidized part of the strip. This would lead to damaging or scorching of the foil.

This harmful tendency is opposed first of all by dividing the bath into sections 30 to 35, by the distribution and arrangement of the cathode, and by the separate power supply.

As shown in FIG. 6 the cathodes 50 to 56 are supplied from a common transformer 60 via individual rectifiers 62, 64, 66 and 68 which are adjusted for each cathode. The leads from the rectifiers 62 to 68 are so connected to the transformer windings that the cathode next to the entry slit 44 has the lowest voltage. This voltage is then increased with increasing distance of the cathode in question from the entry point 44 and the increase may for example be linear.

It can also be seen in FIG. 6 that the cathodes are placed closer to the strip the further the cathode is from the entry point 44. The strip is fed into the bath through the entry slit 44 and led out through the exit slit 70. Any electrolyte which spills out through these slits is collected in the overflow tanks 45 and 72 and if desired returned to the tank 22. The foil which has now been provided with an aluminum oxide layer is deflected over a roll 74 and led to a coiling roll which is not shown. This coiling roll and/or the roll 74 can be power driven and function as the drive roll to pull the strip from the uncoiling roll which is not shown through the bath. A strip speed can be 1-2 m/min. with the device shown. A 50 cm wide strip of which 13.5 m is immersed in the electrolyte at any given time and using a current density of 139 A/mm$^2$ can be provided continuously with an aluminum oxide layer 8 $\mu$m thick with a throughput of 480 m$^2$/8 h.

Figure 7:
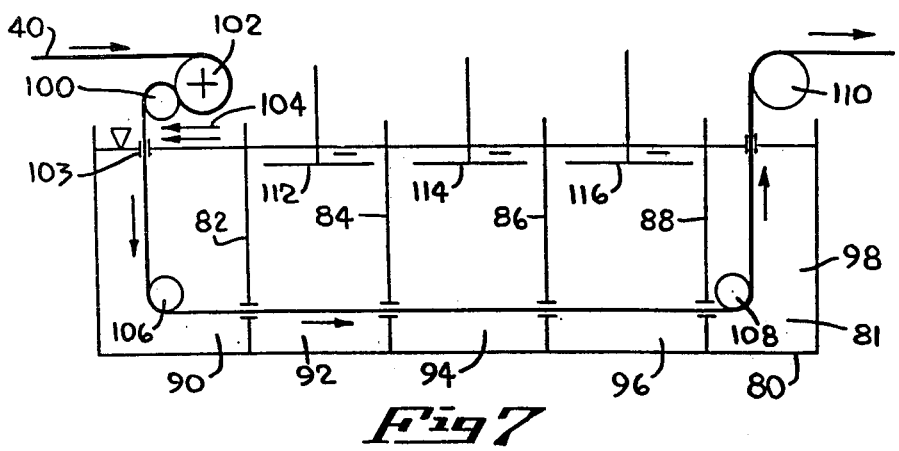
FIG. 7: The same kind of schematic drawing as in FIG. 6, this time showing another version of the device.

The device as in FIG. 7 has a container 80 which is divided into sections 90, 92, 94, 96 and 98 by the dividing walls 82, 84, 86 and 88. In contrast to the device shown in FIG. 6 the strip 40 is led over a small watercooled deflection roll 100. There is also provided, separate from this, an anode roll 102 which contacts the strip on its aluminum side if a composite is used at about the height of the deflection roll. With this arrangement the distance the strip covers in the air between the point it loses contact with the anode roll 102 and the point of entry 103 into the electrolyte 81 is kept very short. Also, in the case of the device in accordance with FIG. 7 there is provided however a means of cooling with ventilators for this distance traversed in the air, and the amount of cooling can be changed to suit the needs of various strip speeds. The ventilators blow onto the strip in the direction of the arrow 104.

The strip is deflected into a horizontal plane in the first section by means of a further deflection roll 106 and led through the dividing walls, through the individual sections of the bath to another deflection roll 108 in the last section 98 where the strip is led vertically upwards again and out to a power driven roll which pulls the strip through the tank.

In the example shown in FIG. 7 a cathode 112, 114 and 116 is arranged in each of the sections 92 to 96 all at the same distance from the strip and facing its aluminum side. In contrast to the device shown in FIG. 6, however, the cathode 112 is separated from the entry point 103 by a dividing wall 82. This dividing wall is provided however with the device in accordance with FIG. 7 to avoid a short circuit between the entry point 103 of the strip and the cathode 112. A short circuit could otherwise occur because the resistance to the passage of the electric current is smaller there than through the bath and the strip which has an increasingly thicker oxide layer the further from the entry point 103 and therefore has a larger electrical resistance.

The power supply to the cathodes 112, 114 and 116 is not shown in FIG. 7. It can take place in the same way as in the device shown in FIG. 6 where the transformer winding 60 is connected to the anode supply via a supply line 61 which ends in an arrow in FIG. 6.

The described anodic oxidation of the foil, in practice, takes place only after some preparatory treatment of the foil. The foil is firstly degreased and then with intermediate rinsing, is etched, neutralized and dried. These treatments can for the greater part take place by immersion and/or spraying and usefully are done continuously and at the same rate as the anodic oxidation. After the anodic oxidation and a subsequent rinsing the strip can be treated with a nitric acid solution, rinsed again and then colored in a continuous process whereby the quality of the color is dependent on the thickness of the aluminum oxide layer produced by the anodic oxidation. The minimum thickness of oxide layer is about 3 $\mu$m. The coloring takes place conventionally by immersing in a bath whereby the indigenous pores in the aluminum oxide layer are filled with coloring material. Following on from the coloring stage the strip is rinsed once more and then subjected to a sealing operation. In the sealing operation the pores filled with coloring material are closed by making the oxide layer swell in almost boiling water. In this stage care must be taken that the support foil does not become wavy on immersing in hot water or steam. For this reason the sealing temperature is lower than in the normal sealing operation and in one device used was 80° C.

The result is a foil material with a colored and sealed aluminum oxide. In the final manufacturing stage of a composite material, the aluminum oxide layer may be coated with a PR layer as processed as aforesaid.

This invention may be embodied in other forms or carried out in other ways without departing from the spirit or essential characteristics thereof. The present embodiment is therefore to be considered as in all respects illustrative and not restrictive, the scope of the invention being indicated by the appended claims, and all changes which come within the meaning and range of equivalency are intended to be embraced therein.

What is claimed is:

1. A device for the production of anodized aluminum or aluminum alloy foil in strip form in an electrolyte bath which comprises: an entry point to said bath; an anode roll spaced from said entry point and bath over which the foil passes on its way to said entry point and bath; a plurality of cathodes in said electrolyte bath through which the foil passes; and means to increase the effect of said cathodes on said foil with increasing distance of the foil in the electrolyte from the point of entry in order to compensate for increased electrical resistance by virtue of oxide growth and achieve uniform oxidation over the entire length of the bath.

2. A device according to claim 1 wherein the strip of foil is a continuous strip.

3. A device according to claim 1 wherein said foil is a composite material including a first layer of flexible plastic material and a second layer of aluminum or aluminum alloy adhesively bonded thereto, wherein the aluminum side of the composite faces the anode roll.

4. A device according to claim 1 wherein said cathodes are supplied with increasingly greater voltage the further they are from said point of entry.

5. A device according to claim 1 wherein said cathodes are arranged closer to the foil the further they are from said point of entry.

6. A device according to claim 1 wherein said cathodes are arranged so that the distance therebetween can be varied.

7. A device according to claim 1 wherein said cathodes are arranged so that the distance between the cathodes and foil can be varied.

8. A device according to claim 1 wherein the angle of the cathodes in relation to the foil can be varied.

9. A device according to claim 1 wherein said bath is divided into a plurality of sections, with one cathode located in each section.

* * * * *